(12) United States Patent
Yang et al.

(10) Patent No.: US 9,136,186 B2
(45) Date of Patent: Sep. 15, 2015

(54) METHOD AND APPARATUS FOR MAKING A SEMICONDUCTOR DEVICE

(71) Applicant: EPISTAR CORPORATION, Hsinchu (TW)

(72) Inventors: Yu-Chih Yang, Hsinchu (TW); Wu-Tsung Lo, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 132 days.

(21) Appl. No.: 13/741,938

(22) Filed: Jan. 15, 2013

(65) Prior Publication Data
US 2014/0199784 A1 Jul. 17, 2014

(51) Int. Cl.
*H01L 21/66* (2006.01)
*H01L 21/67* (2006.01)

(52) U.S. Cl.
CPC .......... *H01L 22/12* (2013.01); *H01L 21/67288* (2013.01); *H01L 22/20* (2013.01)

(58) Field of Classification Search
CPC ..... H01L 22/24; H01L 21/6715; H01L 22/12; H01L 22/20
USPC ............................................. 438/4, 7, 12, 16
See application file for complete search history.

(56) References Cited

U.S. PATENT DOCUMENTS

| | | | |
|---|---|---|---|
| 6,803,240 B1 * | 10/2004 | Bedell et al. | 438/12 |
| 7,979,969 B2 | 7/2011 | Basol | |
| 8,236,593 B2 * | 8/2012 | Arena et al. | 438/44 |
| 8,236,604 B2 * | 8/2012 | Schultz-Wittmann et al. | 438/98 |
| 8,466,051 B2 * | 6/2013 | Lin et al. | 438/572 |
| 2009/0186466 A1 * | 7/2009 | Brewer | 438/476 |
| 2010/0201374 A1 | 8/2010 | Vasilyev et al. | |
| 2011/0259417 A1 * | 10/2011 | Toyokawa et al. | 136/256 |

* cited by examiner

*Primary Examiner* — Savitr Mulpuri
(74) *Attorney, Agent, or Firm* — Muncy, Geissler, Olds & Lowe, P.C.

(57) ABSTRACT

Disclosed is an apparatus and method for yield enhancement of making a semiconductor device. The apparatus for yield enhancement of making a semiconductor device comprises: a semiconductor device comprising an epitaxial layer in which a defect is included, and a photo-resistor on the epitaxial layer and covering the defect; an image recognition system to detect and identify a location of the defect; and an exposing module comprising a first light source to expose a part of the photo-resistor substantially corresponding to the detected defect identified by the image recognition system.

7 Claims, 9 Drawing Sheets

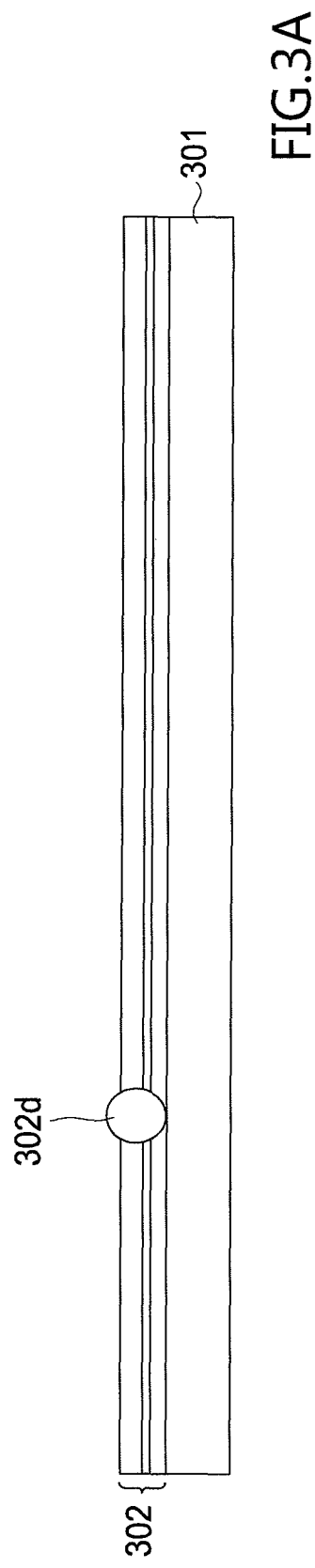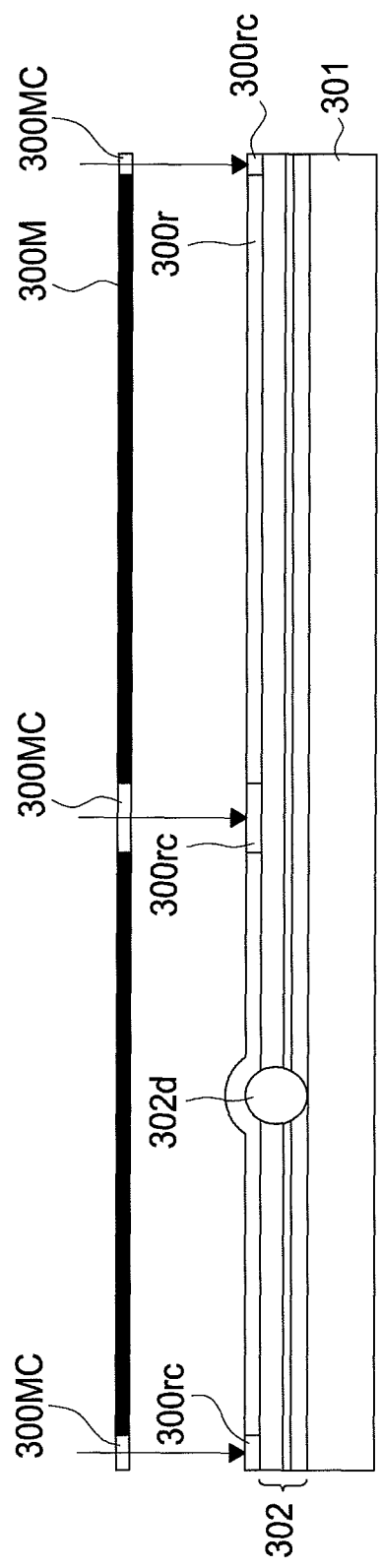

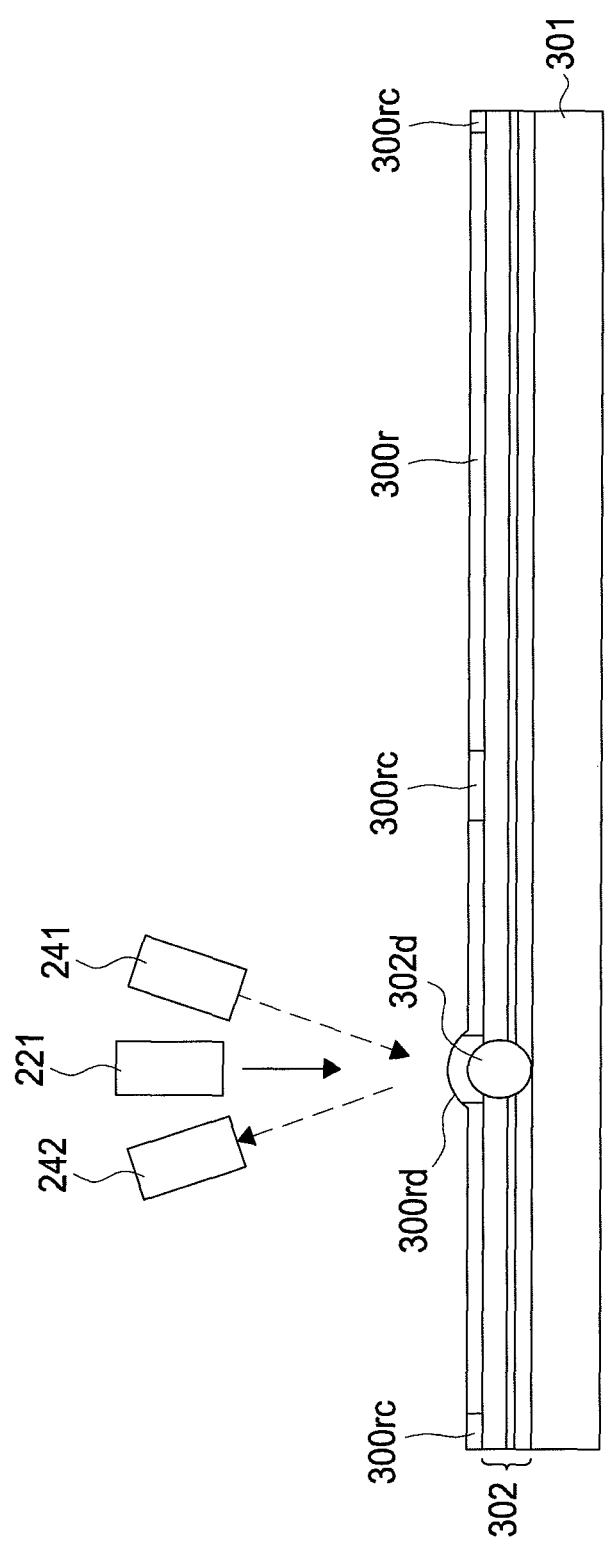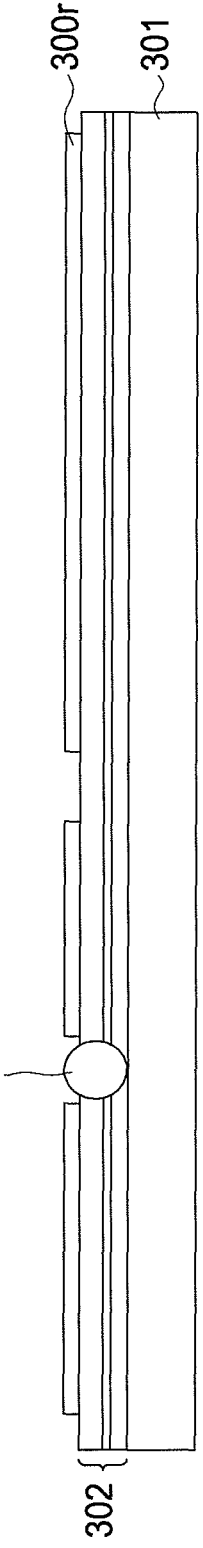

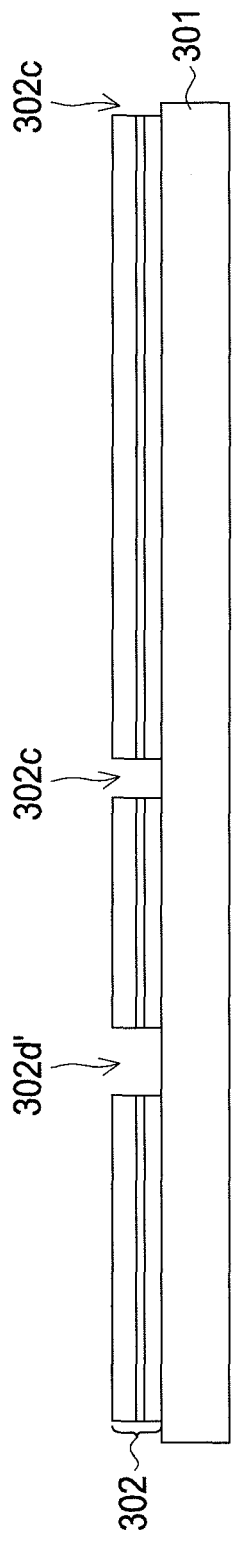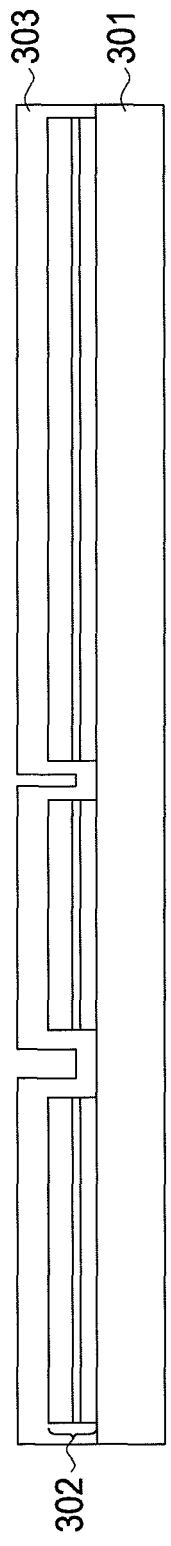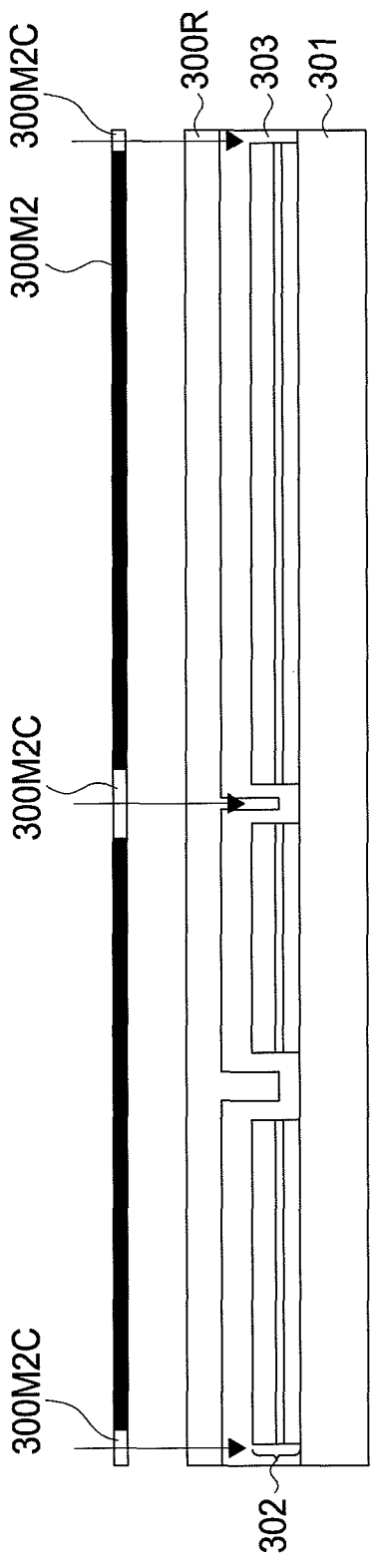

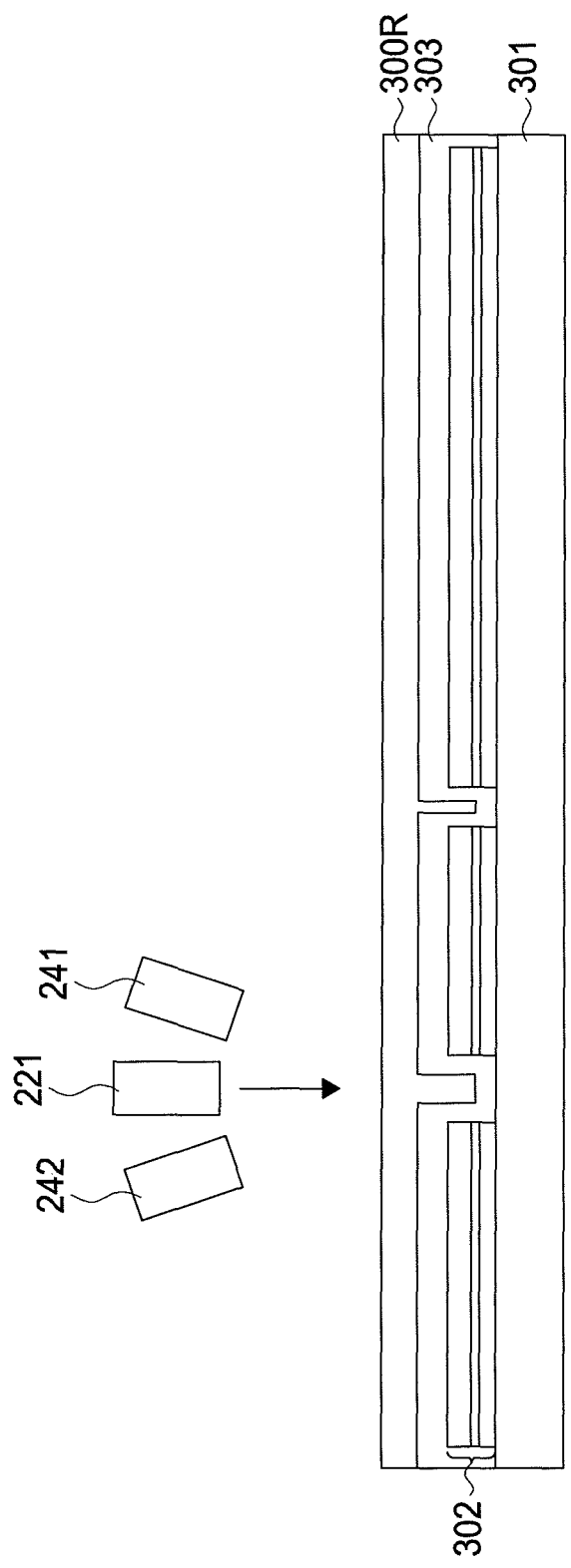
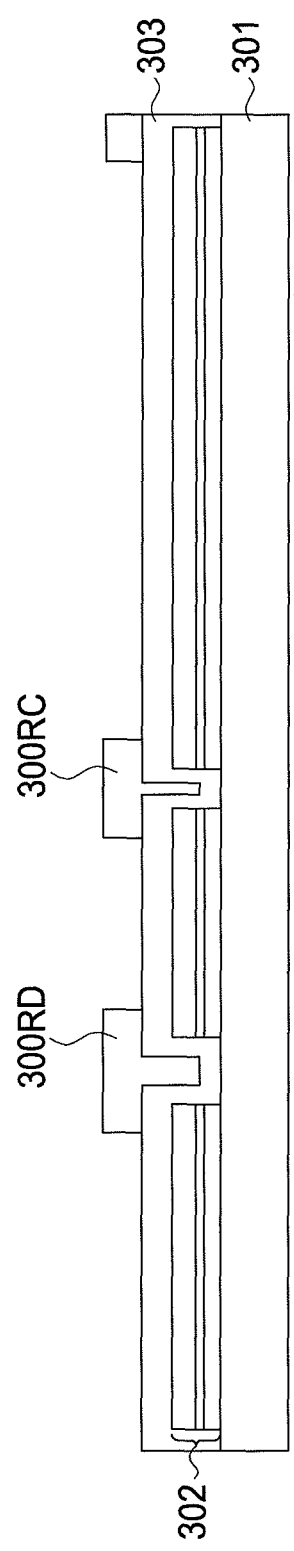
FIG.3H
FIG.3I

METHOD AND APPARATUS FOR MAKING A SEMICONDUCTOR DEVICE

TECHNICAL FIELD

The application relates to an apparatus and method for making a semiconductor device, and more particular to an apparatus and method for yield enhancement of making a semiconductor device by detecting a defect included in an epitaxial layer of the semiconductor device and forming a photo-resist comprising a region substantially corresponding to the detected defect.

DESCRIPTION OF BACKGROUND ART

Because the petroleum source is limited, various kinds of substitutive energy are developed extensively and turned into products. Among those, the solar cell has become the commercial products for either the industrial or the residential use, and the III-V group material solar cell is mainly applied to the space industry and the industrial field because of its high conversion efficiency.

However, there are many kinds of defects existing in/on the epitaxial layer of III-V group material. For example, as shown in FIG. 1, a pinhole defect 101 which is usually caused by a dislocation under stress occurs during the epitaxial growth of the III-V group material, and cracks 102 along the lattices also happen, especially in the wafer bonding process or the substrate transferring process. There are other kinds of defects, such as particles on the epitaxial layer or hilllocks which are particles covered by the epitaxial layer and exists in the epitaxial layer. These defects in/on the epitaxial layer result in device problems such as current leakage, and make the photovoltaic device operate abnormally. As the demand for a larger size photovoltaic device increases, the yield loss due to the defect becomes higher. For example, a 4-inch wafer produces only two photovoltaic devices used in aerospace industry, and the defect in/on the epitaxial layer results in 50% yield loss accordingly. In some prior art, a laser is used to burn and remove the defects. However, it is difficult to remove the residual material produced in the laser treatment, and the residual material may also lead to a current leakage.

SUMMARY OF THE DISCLOSURE

Disclosed is an apparatus and method for yield enhancement of making a semiconductor device. The apparatus for yield enhancement of making a semiconductor device comprises: a semiconductor device comprising an epitaxial layer in which a defect is included, and a photo-resist on the epitaxial layer and covering the defect; an image recognition system to detect and identify a location of the defect; and an exposing module comprising a first light source to expose a part of the photo-resist substantially corresponding to the detected defect identified by the image recognition system. The method for yield enhancement of making a semiconductor device, comprises the steps of: providing a semiconductor device comprising an epitaxial layer in which a defect is included; coating a photo-resist on the epitaxial layer; providing an image recognition system to detect and identify a location of the defect; exposing a part of the photo-resist substantially corresponding to the detected defect identified by the image recognition system; developing to remove the exposed part of the photo-resist; and removing a part of the epitaxial layer where the photo-resist is removed. Also disclosed is a method for yield enhancement of making a semiconductor device, comprising the steps of providing a semiconductor device comprising an epitaxial layer in which a defect is included; providing an image recognition system to detect and identify a location of the defect; forming a photo-resist on the epitaxial layer, wherein a part of the photo-resist is removed to substantially correspond to the detected defect identified by the image recognition system; and removing a part of the epitaxial layer with the photo-resist.

BRIEF DESCRIPTION OF THE DRAWINGS

FIGS. 3A to 3L illustrate a method in accordance with one embodiment of the present application.

DETAILED DESCRIPTION OF PREFERRED EMBODIMENTS

Figure 2A:
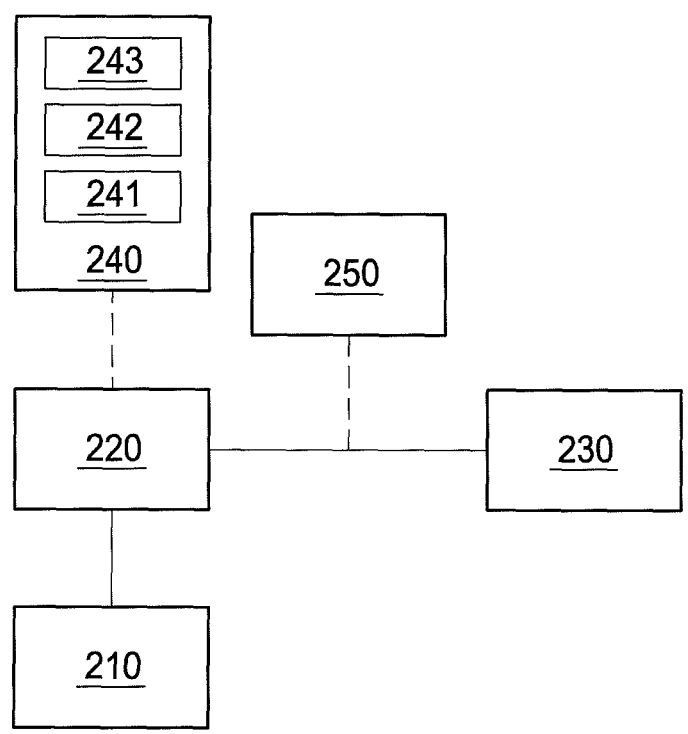
FIG. 2A illustrates the function block diagram of the apparatus in accordance with one embodiment of the present application.
Figure 2B:
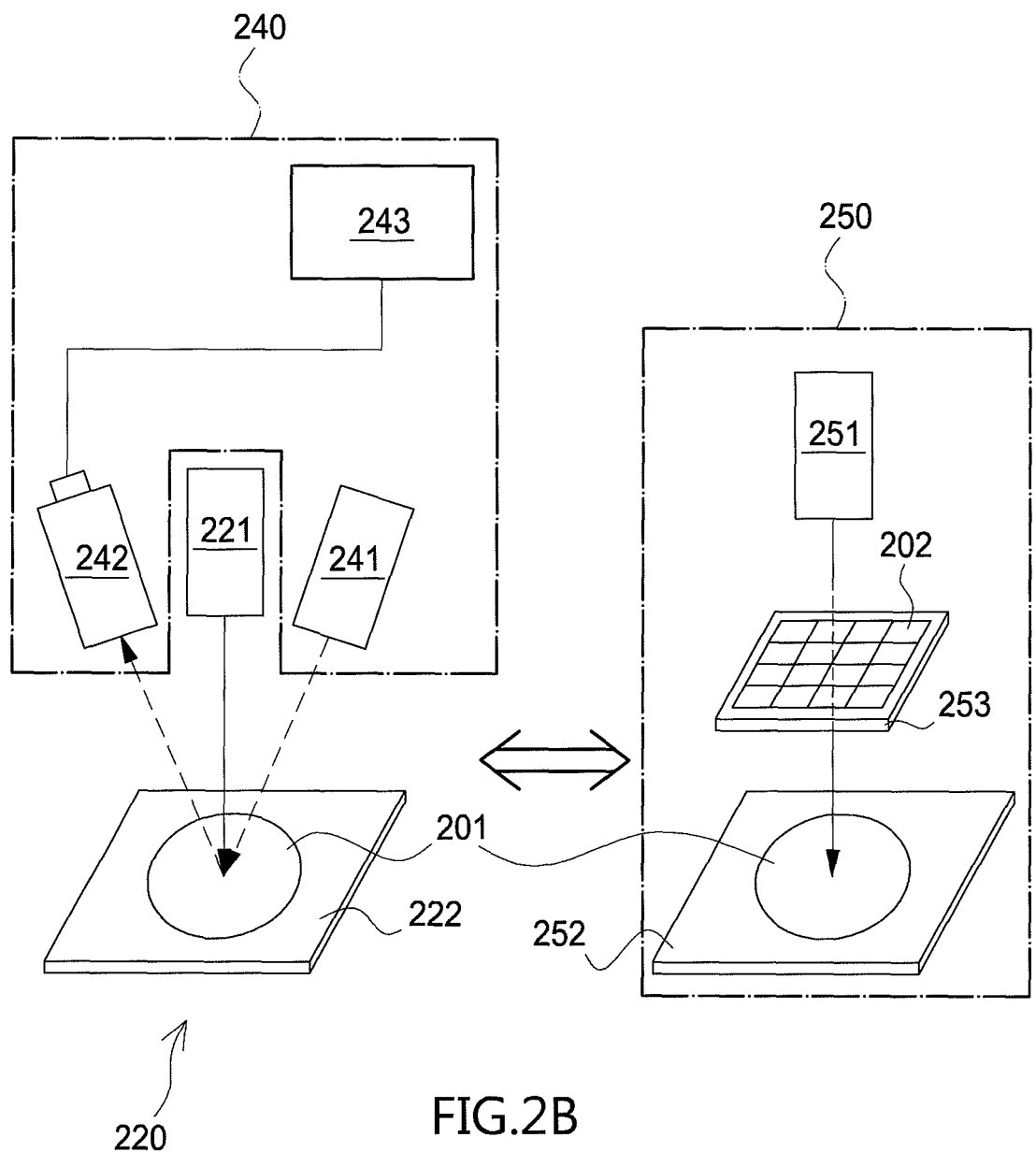
FIG. 2B illustrates the details of a part of the apparatus in FIG. 2A.

FIG. 2A and FIG. 2B illustrate an apparatus in accordance with one embodiment of the present application. FIG. 2A shows the function block diagram of the apparatus, and FIG. 2B illustrates the details of a part of the apparatus. Please refer to FIG. 2A. The apparatus 200 is used for detecting a defect included in an epitaxial layer on a substrate of a wafer and forming a photo-resist comprising a region substantially corresponding to the detected defect. The apparatus 200 comprises a coating module 210, an exposing module 220, a developing module 230, and an image recognition system 240. The apparatus 200 may further comprise a mask-used exposing module 250 to transfer a pattern on a mask, such as cutting lines, to the photo-resist for use in other process. It is noted that the mask-used exposing "module" can also be in the form of an "apparatus" which is associated with the apparatus 200. Here a "module" means a part of an "apparatus" and provides a specific function in the apparatus when assembled to the apparatus. A module cannot function independently. In contrast, an apparatus can function independently, and can be optionally associated with another apparatus to perform its function. And "associated with" means the electrical signals are exchanged, and sometimes may also mean mechanical connection if necessary.

The coating module 210 is used to coat a photo-resist on the epitaxial layer. The exposing module 220 comprising a first light source (not shown) is used to expose a part of the photo-resist. The image recognition system 240 is used to detect the defect and comprises a second light source 241, an image sensor 242, and a comparison unit 243. It is noted that the image recognition system 240 can be set inside the exposing module 220 or a different module separated from the exposing module 220. In another embodiment, only some elements of the image recognition system 240 such as the second light source 241 and the image sensor 242 are inside the exposing module 220, and the electrical signals can be exchanged between the image recognition system 240 and the exposing module 220. In the case that the whole image recognition system 240 is set inside the exposing module 220 or in the case that some elements of the image recognition system 240 are set inside the exposing module 220, the defect detecting and the exposing step can be performed substantially at the same time. That is, the defect is detected by the image recognition system 240 and the part of the photo-resist substantially corresponding to the defect detected is exposed by the exposing module 220 immediately. When the image recognition system 240 is not in a module separated from the exposing module 220, the time interval between the finish of defect detecting and the actuation of the exposing step is very short because there is not time spent on wafer transferring between two separated modules. If the image recognition system 240 is set inside a module separated from the exposing module 220, the wafer may be first loaded into the module where the image recognition system 240 is set inside to detect the defect, and then the information of the location of the defect detected is sent to the exposing module 220 to which the wafer is then transferred, and the part of the photo-resist substantially corresponding to the defect detected is exposed accordingly.

As mentioned above, the apparatus 200 may further comprise a mask-used exposing module 250 or be associated with a mask-used exposing apparatus 250 to transfer a pattern on a mask to the photo-resist. A part of the photo-resist corresponding to the pattern in the mask may be optionally exposed by the mask-used exposing module (or apparatus) 250 before the detecting step or after the exposing step. The part of the photo-resist corresponding to the pattern in the mask together with the exposed part of the photo-resist substantially corresponding to the defect detected may be removed later in a developing step. The developing module 230 is used to develop the exposed photo-resist so the part of the photo-resist exposed by the first light source in the exposing module 220 and the part exposed by the mask-used exposing module (or apparatus) 250 are removed after the developing.

Please refer to FIG. 2B. The left part of the figure illustrates the details of the image recognition system 240 and some parts of the exposing module 220. The right part of the figure illustrates the mask-used exposing module (or apparatus) 250. The image recognition system 240 comprises elements enclosed by the broken line, i.e. the second light source 241, the image sensor 242, and the comparison unit 243, and the exposing module 220 comprises a first light source 221 and a platform 222. As mentioned above, the figure shows the case which the whole image recognition system 240 is set inside the exposing module 220 and the electrical signals of the image recognition system 240 and the exposing module 220 are exchanged so that the detecting of the defect and the exposing step are performed substantially at the same time. A wafer 201 is loaded into the exposing module 220 and disposed on a platform 222 of the exposing module 220. The platform 222 carries the wafer 201 and moves under the first light source 221 of the exposing module 220 and the second light source 241 and the image sensor 242 of the image recognition system 240. The second light source 241 provides illumination for image recognition and is different from the first light source 221 used for exposing. For example, when the photo-resist is a positive type photo-resist, the first light source is UV light which causes the positive type photo-resist to have a chemical reaction, and the second light source is non-UV light which provides illumination for image recognition and does not cause the positive type photo-resist to have a chemical reaction. The image sensor 242 is used to capture an image of a pattern on the epitaxial layer on the wafer 201. The image sensor 242 comprises, for example, a CCD (Charge-coupled Device) or a CMOS image sensor. The comparison unit 243 is used to compare the image of the pattern captured by the image sensor 242 with a pre-determined pattern stored in the comparison unit 243 for determining whether the pattern is a defect or not. The whole image recognition system 240 is set inside the exposing module 220 and the electrical signals of the image recognition system 240 and associated with the exposing module 220 are exchanged so that the detecting of the defect and the exposing step are performed substantially at the same time. That is, the wafer 201 is moved to be scanned by the image sensor 242, and when a defect is determined by the comparison unit 243, a signal from the comparison unit 243 is transferred to the exposing module 220 so that the first light source 221 is actuated to expose the part of the photo-resist substantially corresponding to the defect detected.

In addition, as mentioned in FIG. 2A, the wafer 201 may be optionally transferred to the mask-used exposing module (or apparatus) 250 before the detecting step or after the exposing step. It is noted that when the wafer 201 is transferred to the mask-used exposing module (or apparatus) 250 before the detecting step, the wafer 201 is transferred directly from the coating module 210 after the aforementioned coating step.

The mask-used exposing module (or apparatus) 250 comprises a mask table 253 on which a mask 202 is disposed, a platform 252 on which the wafer 201 is disposed on, and a light source 251. A part of the photo-resist corresponding to a pattern in the mask 202 may be optionally exposed by the mask-used exposing module (or apparatus) 250 with the light source 251 before the detecting step or after the exposing step. The light source 251 may be the same as the first light source 221, i.e. UV light. The pattern in the mask 202 comprises, for example, cutting lines around a solar cell chip.

FIGS. 3A to 3L illustrate a method in accordance with one embodiment of the present application. The method is used for removing a defect from an epitaxial layer on a substrate of a wafer and can be further used for forming a photovoltaic device. The method may be carried out with the utilization of the apparatus as previously illustrated in FIGS. 2A and 2B.

Figure 1:
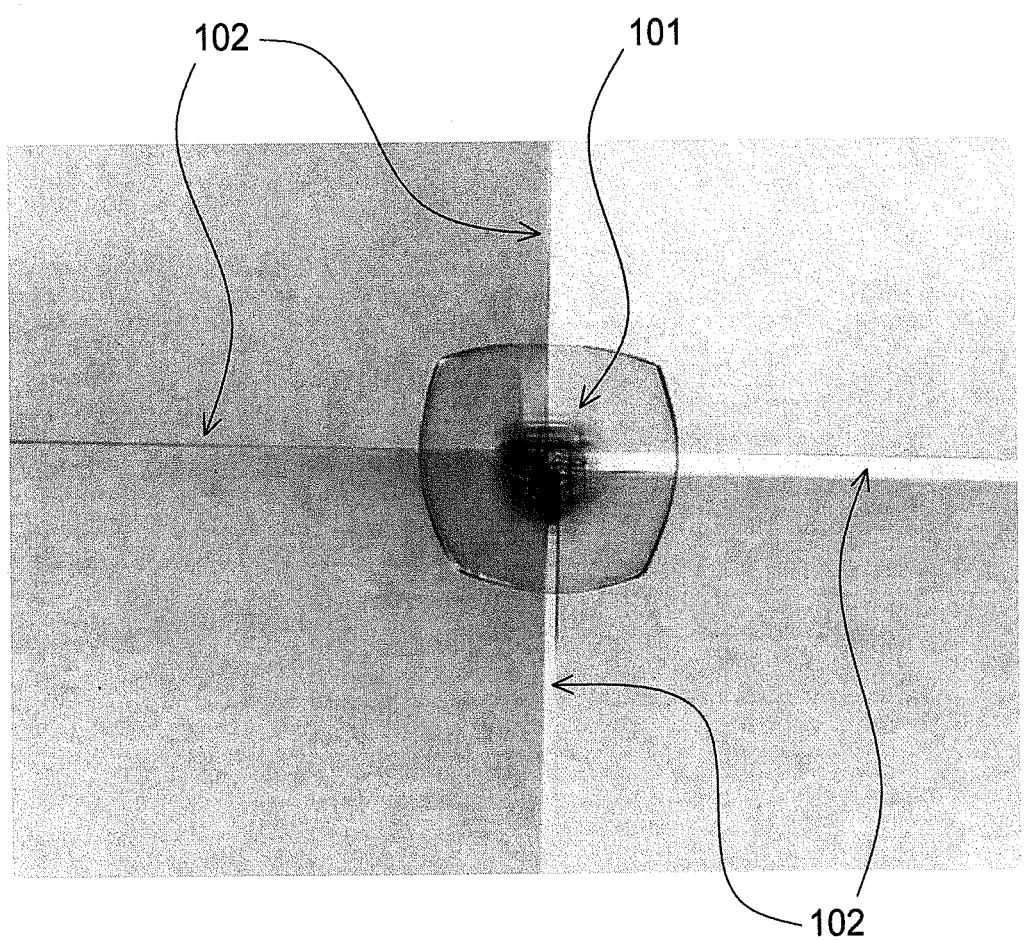
FIG. 1 illustrates defects existing in/on the epitaxial layer of III-V group material of a photovoltaic device known in the prior art.

As shown in FIG. 3A, the method comprises providing a wafer comprising a substrate 301 on which an epitaxial stack 302 is formed first. The epitaxial stack 302 comprises a plurality of layers of III-V group material to form at least one p-n junction of a solar cell. The epitaxial stack 302 comprises a defect 302*d*. The defect 302*d* may be any one of those illustrated in FIG. 1. In FIG. 3B, a photo-resist 300*r* is coated on the epitaxial stack 302 by the aforementioned coating module 210. The wafer is then transferred to the aforementioned mask-used exposing module (or apparatus) 250 directly from the coating module 210 after the coating step. As mentioned above, this embodiment illustrates a case which a mask-used exposing is performed before a defect detecting step. The defect detecting step will be illustrated later in FIG. 3C. In the embodiment, a mask 300M is used, and the pattern in the mask 300M, which is a pattern for cutting lines 300MC around a solar cell chip, is transferred to the photo-resist 300*r* with an exposing by light (as the arrows shows) from the light source 251 of the mask-used exposing module (or apparatus) 250 shown in FIG. 2B. The exposed pattern 300*rc* in the photo-resist 300*r* is used for forming the cutting lines in the wafer as will be illustrated later in FIG. 3E.

As shown in FIG. 3C, this embodiment illustrates a case which the detecting of the defect and an exposing step are performed substantially at the same time by using the apparatus shown in FIG. 2B, and the wafer is transferred to the aforementioned exposing module 220 and a defect detecting step is performed. The wafer is scanned by the aforementioned image sensor 242 with the illumination provided by light from the second light source 241. And once a defect, for example, the defect 302*d* is detected, the first light source 221 is actuated to expose the part of the photo-resist 300*rd* which is substantially corresponding to the defect detected. The first light source 221 used for exposing is different from the second light source 241 for image recognition. For example, the photo-resist 300r in this embodiment is a positive type photo-resist, and the first light source 221 is UV light which causes the positive type photo-resist 300r to have a chemical reaction, and the second light source 241 is non-UV light which provides illumination for image recognition and does not cause the positive type photo-resist to have a chemical reaction. The process of the exposing step is illustrated in FIG. 4. In FIG. 4, the light from the first light source 221 is projected onto the defect and forms a spot as denoted as a circle. The wafer is moved as the aforementioned platform 222 carrying the wafer moves, and spots are formed upon the wafer. In this example, as mentioned previously in FIG. 1, two kinds of defects, i.e., a pinhole defect 101 and cracks 102 are shown, and the area of these defects forms a defect area. The spots as denoted are formed substantially along the contour of the defect area and cover the whole defect area. Finally, the collection of these circles forms the exposed part as denoted by the solid line in the figure to cover the defect area. The area of the exposed part is substantial the same as or a little larger than the defect area. It is noted that the information of the location of the defect detected may be stored in the same apparatus or sent to another apparatus for a later use.

Figure 3J:
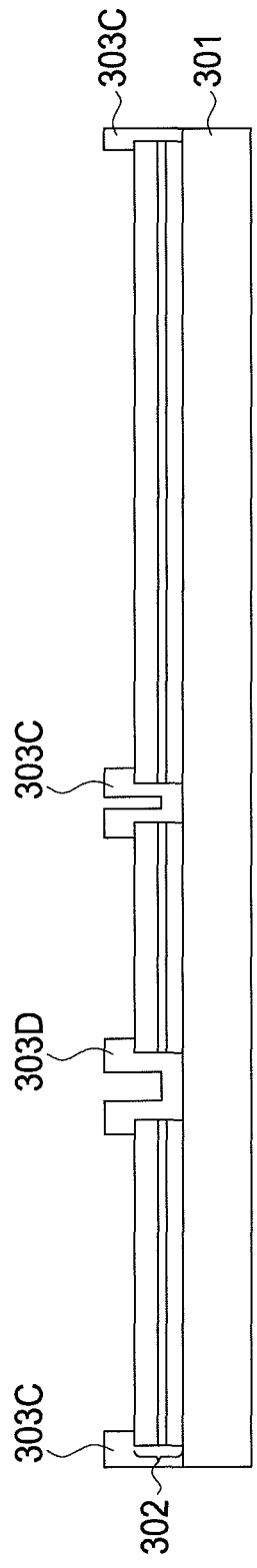
Figure 4:
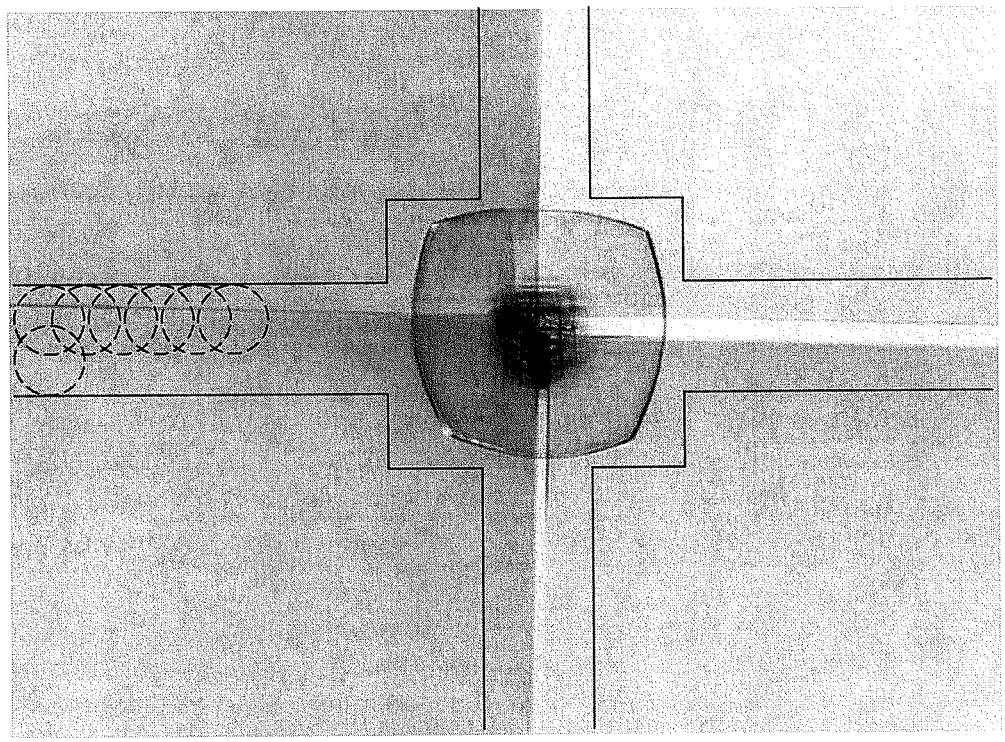
FIG. 4 illustrates the process of the exposing step related to the method in FIGS. 3A to 3L.

And then as shown in FIG. 3D, the wafer is transferred to the aforementioned developing module 230, and the photo-resist 300r is developed to remove the exposed part of the photo-resist 300r so that a subsequent etch process is performed with the developed photo-resist 300r as a mask to remove the part of the epitaxial layer where the photo-resist is removed. The result after the etch process is shown in FIG. 3E where an empty part 302d' substantially corresponding to the defect 302d detected and an empty part 302c corresponding to a cutting line are formed in the epitaxial stack. The etch process may be a dry etch or a wet etch, and the photo-resist 300r is removed after the etch process. Then as shown in FIGS. 3F to 3J, a dielectric material is formed substantially in the region where the epitaxial stack 302 is removed; in other words, a dielectric material is formed in the empty part 302d' and the empty part 302c shown in FIG. 3E. As shown in FIG. 3F, a dielectric layer 303 is formed. The dielectric layer 303 may be, for example, alumina, titanium dioxide, silicon nitride ($SiN_x$) or silicon oxide ($SiO_x$). In FIG. 3G, a negative photo-resist 300R is coated on the dielectric layer 303, and an exposing is performed on the photo-resist 300R with a mask 300M2. The area of the pattern 300M2C may be a little larger than the area of the pattern 300MC in FIG. 3B. The exposing can be performed by the mask-used exposing module (or apparatus) 250. Since the photo-resist 300R is a negative type, as will be illustrated in FIG. 3I, the exposed part is left as a remaining part after developing. And then in FIG. 3H, the information of the location of the defect detected stored as previously mentioned in FIG. 3C is used so that an exposing step may be carried out accordingly. The area of the exposed part can be substantial the same as or a little larger than the area of the empty part 302d' shown in FIG. 3E. As a result, as shown in FIG. 3I, after a developing step, a first remaining part 300RD substantially corresponding to the area of the defect 302d detected and a second remaining part 300RC corresponding to cutting lines of the negative photo-resist 300R are formed on the dielectric layer 303. And then in FIG. 3J, an etch process is performed to remove the part of the dielectric layer 303 uncovered by the first remaining part 300RD and the second remaining part 300RC of the photo-resist 300R, and dielectric material 303D and 303C is formed substantially in the region where the epitaxial layer is removed. The etch process may be a dry etch or a wet etch, and first and second remaining parts 300RD and 300RC of the photo-resist are removed after the etch process. The dielectric material 303D is formed in the region corresponding to the empty part 302d' in FIG. 3E which is removed for the defect 302d, and the dielectric material 303C is formed in the region corresponding to empty part 302c in FIG. 3E which is removed for the cutting lines 303c. The dielectric material 303D provides an electrical isolation to the sidewalls of the empty part 302d', and therefore avoids forming a current leakage path or the failure of the p-n junction in the epitaxial stack 302. In addition, when an electrode passes or is located on the empty part 302d', the dielectric material 303D provides an electrical isolation between the electrode and the junction to avoids a shortage.

Figure 3K:
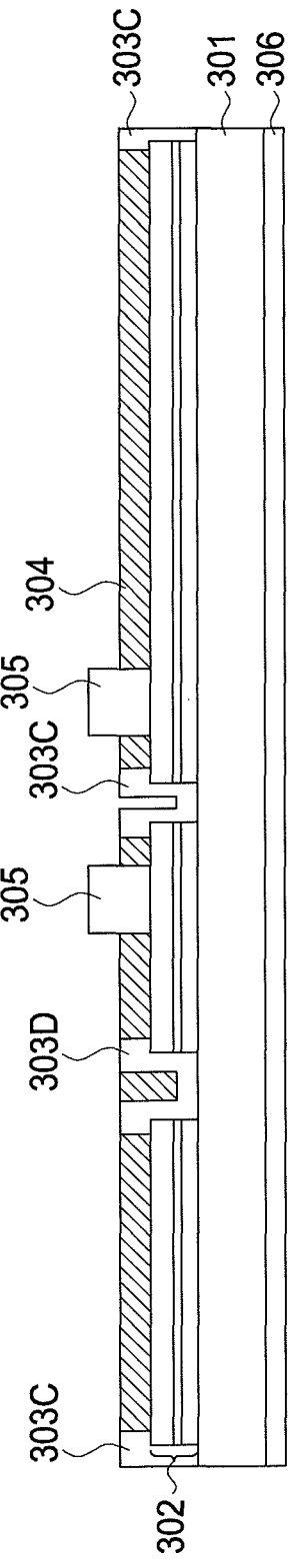
Figure 3L:
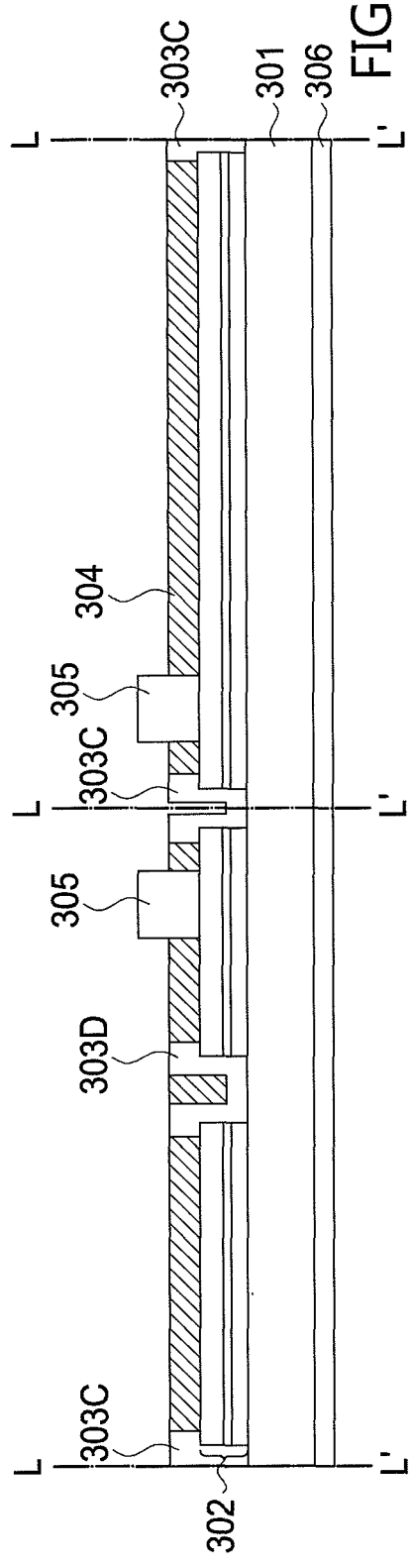

As shown in FIG. 3K, an anti-reflective layer 304, the first electrode 305, and the second electrode 306 are subsequently formed. The main portion of the anti-reflective layer 304 is formed on the epitaxial stack 302 while a portion of the anti-reflective layer 304 is formed on the dielectric material 303D to fill the concave part caused by the empty part 302d' in FIG. 3E with the dielectric material 303D formed thereon. The first electrode 305 is formed in the anti-reflective layer 304 and on the epitaxial stack 302. The second electrode 306 is formed on the surface of substrate 301 opposite to the surface on which the epitaxial stack 302 is disposed. And in FIG. 3L, as mentioned above, the cutting lines are formed around a solar cell chip, and the substrate 301 is cut along the cutting lines as indicated by the line LL' to form the solar cell chips.

It is noted that the process flow shown in this embodiment may be adjusted by the person of the skill in the art. For example, though the cutting line pattern, i.e. the mask-used exposing, is performed before the detecting step in this embodiment, it is apparent that the mask-used exposing may be performed after the detecting step. Besides, the coating step may be performed after the detecting step. For example, the wafer may be first loaded to an separated module where the image recognition system 240 is set inside (or the exposing module 220 comprising an image recognition system set inside it) to have the detecting step performed, and then the wafer is transferred to the coating module 210 to have the coating step performed. And finally the stored information of the location of the detected defect is used in the exposing module 220 to have the exposing step performed accordingly after the coating step. Similarly, the order for the wafer to be transferred between different modules in the apparatus may be designed by the person of the skill in the art accordingly as the above illustration. In addition, though the four modules are integrated in one apparatus as shown in FIG. 2A, one or more modules may be separated and formed as an independent apparatus by the person of the skill in the art. It is also noted that application of the apparatus and the method illustrated in the present application is not limited to a photovoltaic device, and can be commonly used for a semiconductor device, such as an LED. The yield of the semiconductor device is enhanced by detecting and removing the defect included in an epitaxial layer of the semiconductor device and forming a dielectric material in the region where the epitaxial layer is removed to provide an electrical isolation and avoid problems such as current leakage.

The above-mentioned embodiments are only examples to illustrate the principle of the present invention and its effect, rather than be used to limit the present invention. Other alternatives and modifications may be made by a person of ordinary skill in the art of the present application without escaping the spirit and scope of the application, and are within the scope of the present application.

What is claimed is:

1. A method for yield enhancement of making a semiconductor device, comprising the steps of:
   providing a semiconductor device comprising an epitaxial layer in which a defect is included;
   coating a photo-resist on the epitaxial layer;
   detecting and identifying a location of the defect by an image recognition system;
   exposing a part of the photo-resist substantially corresponding to the detected defect identified by the image recognition system;
   developing to remove the exposed part of the photo-resist;
   removing a part of the epitaxial layer where the photo-resist is removed; and
   forming a dielectric material substantially in a region where the epitaxial layer is removed,
   wherein said removing the part of the epitaxial layer comprises an etching process.

2. The method as claimed in claim 1, wherein the coating step is performed after the detecting step.

3. The method as claimed in claim 1, wherein the detecting step and the exposing step are performed substantially at the same time.

4. A method for yield enhancement of making a semiconductor device, comprising the steps of:
   providing a semiconductor device comprising an epitaxial layer in which a defect is included;
   detecting and identifying a location of the defect by an image recognition system;
   forming a photo-resist on the epitaxial layer, wherein a part of the photo-resist is removed to substantially correspond to the detected defect identified by the image recognition system;
   removing a part of the epitaxial layer with the photo-resist; and
   removing the photo-resist and forming a dielectric material in a region substantially corresponding to the part which the epitaxial layer is removed,
   wherein said removing the part of the epitaxial layer comprises an etching process.

5. The method as claimed in claim 4, further comprising forming an anti-reflective layer on the epitaxial layer and the dielectric material.

6. The method as claimed in claim 5, further comprising forming an electrode disposed in the anti-reflective layer and on the epitaxial layer.

7. The method as claimed in claim 1, further comprising providing a mask and exposing the photo-resist with the mask to expose a cutting line pattern on the photo-resist before the detecting step or after the exposing step, and the part of the photo-resist for the cutting line pattern is removed in the developing step.

* * * * *